United States Patent
Kinyua et al.

(10) Patent No.: US 9,048,791 B2
(45) Date of Patent: Jun. 2, 2015

(54) MULTI-STAGE AMPLIFIER WITH PULSE WIDTH MODULATION (PWM) NOISE SHAPING

(75) Inventors: Martin Kinyua, Cedar Park, TX (US); Eric Soenen, Austin, TX (US); Ruopeng Wang, Shanghai (CN)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 581 days.

(21) Appl. No.: 13/446,047

(22) Filed: Apr. 13, 2012

(65) Prior Publication Data
US 2013/0272545 A1    Oct. 17, 2013

(51) Int. Cl.
H03F 3/38    (2006.01)
H03F 3/217    (2006.01)

(52) U.S. Cl.
CPC ...................................... H03F 3/217 (2013.01)

(58) Field of Classification Search
USPC ......................................... 330/10, 251, 207 A
IPC ....................................... H03F 3/387
See application file for complete search history.

(56) References Cited

U.S. PATENT DOCUMENTS

| | | | |
|---|---|---|---|
| 6,518,838 B1 * | 2/2003 | Risbo ............................. | 330/10 |
| 7,990,215 B2 | 8/2011 | Soenen et al. | |
| 2005/0024133 A1 * | 2/2005 | Midya et al. ................. | 330/10 |
| 2008/0258831 A1 * | 10/2008 | Kunihiro et al. ............. | 332/103 |
| 2008/0278230 A1 * | 11/2008 | Kost et al. ..................... | 330/10 |
| 2010/0109767 A1 * | 5/2010 | Midya et al. ................... | 330/10 |
| 2010/0225391 A1 * | 9/2010 | Kim .................................. | 330/251 |
| 2012/0045076 A1 * | 2/2012 | Gonano et al. ................ | 381/120 |
| 2013/0127531 A1 * | 5/2013 | Lesso ............................. | 330/251 |

OTHER PUBLICATIONS

Matamura, A. et al, "Filterless Multi-Level Delta-Sigma Class-D Amplifier for Portable Applications", IEEE International Symposium on Circuits and Systems, ISCAS 2009, p. 1177-1180.
Forejt, B., et al., "A 700 +– mW Class D Design with Direct Batery Hookup in a 90-nm Process", IEEE Journal of Solid-State Circuits, Sep. 2005, 40(9):1880-1887.

* cited by examiner

Primary Examiner — Patricia T Nguyen
(74) Attorney, Agent, or Firm — Duane Morris LLP

(57) ABSTRACT

A pulse width modulation (PWM) amplifier includes a first amplifier stage, a second amplifier stage, and a gain module. The first amplifier stage is configured to amplify an analog input signal in the analog and digital domains using a first pulse width modulation (PWM) generator, to provide a first stage output for coupling to a load. The gain module is configured to amplify a quantization error of the first PWM generator by a predetermined gain. The second amplifier stage is configured to spectrally shape and attenuate the amplified quantization error of the first PWM generator using a second PWM generator, to provide a second stage output for coupling to the load.

20 Claims, 3 Drawing Sheets

MULTI-STAGE AMPLIFIER WITH PULSE WIDTH MODULATION (PWM) NOISE SHAPING

BACKGROUND

Pulse-width-modulation (PWM) amplifiers, also known as Class-D amplifiers, are a type of amplifier known for their relatively high efficiency in a variety of applications, e.g., amplification of an audio signal. Output stage power devices (typically metal oxide semiconductor field effect transistors, or MOSFETs) in a Class-D amplifier are operated as binary switches, i.e., they are either on or off.

In a Class D amplifier, ideally there are no switching losses, and the switches either have voltage across them but no current flow through them, or current flow through them but no voltage across them. Thus, ideally no heat is dissipated, and all of the power supplied to the Class D amplifier is delivered to the load, yielding theoretical power efficiency of 100%. In practice, non-ideal switching reduces the amplifier's efficiency.

BRIEF DESCRIPTION OF THE DRAWINGS

The following will be apparent from elements of the figures, which are provided for illustrative purposes and are not necessarily to scale.

DETAILED DESCRIPTION

This description of certain exemplary embodiments is intended to be read in connection with the accompanying drawings, which are to be considered part of the entire written description. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise. Likewise, terms concerning electrical coupling and the like, such as "coupled," "connected" and "interconnected," refer to a relationship wherein structures communicate with one another either directly or indirectly through intervening structures unless expressly described otherwise.

Figure 1:
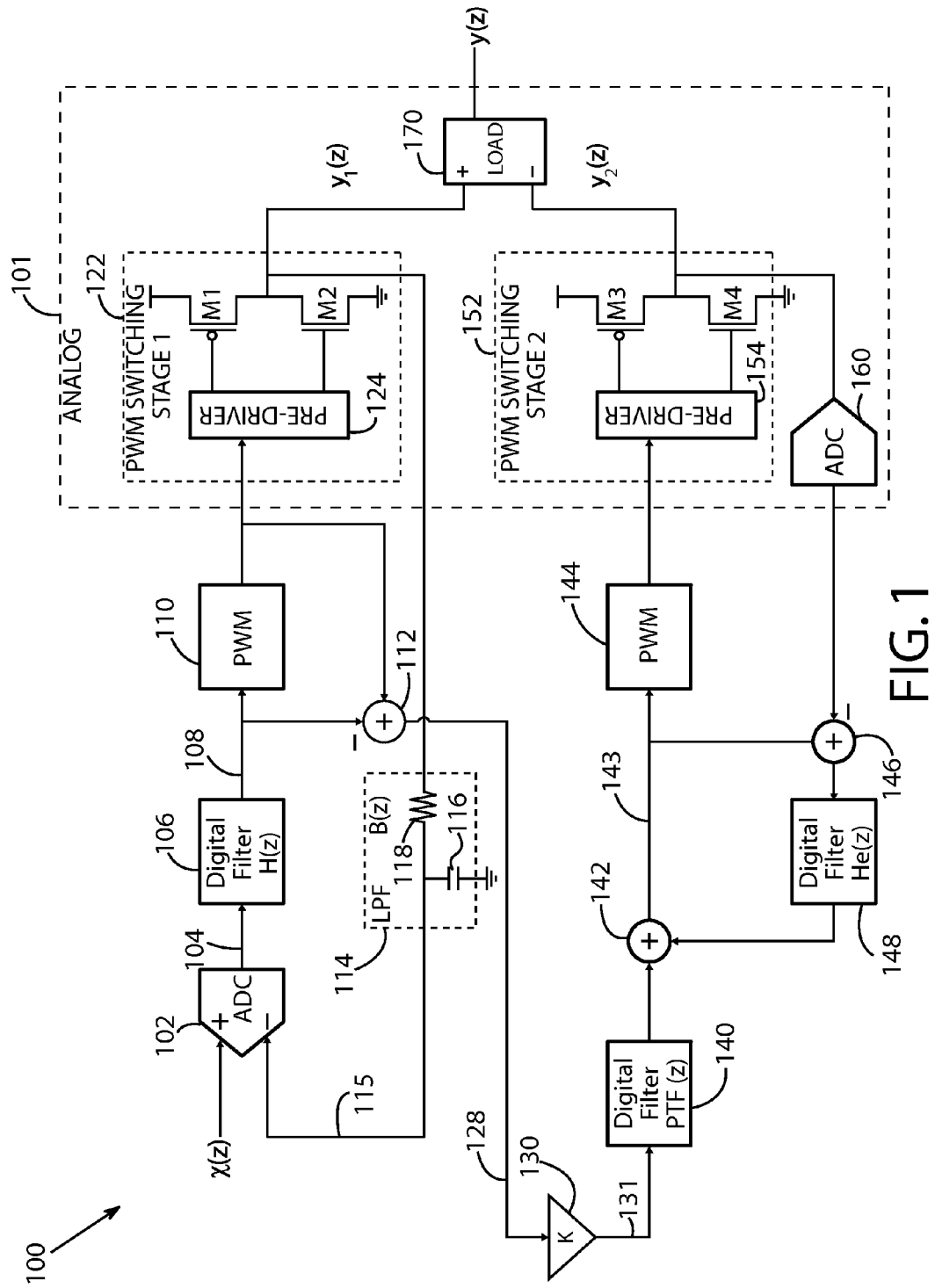
FIG. 1 is a block diagram of a two-stage amplifier in accordance with some embodiments of the present disclosure.

FIG. 1 is a block diagram in accordance with some embodiments of the present disclosure. A two-stage Class-D amplifier 100 provides lower noise and lower total harmonic distortion (THD) than has been available with prior single-stage amplification techniques. The PWM quantization error from a first stage is extracted, gained up, filtered, and provided as input to a second PWM stage that provides second-order PWM noise shaping. When the outputs of the first and second stages are combined, the linearity of Class-D amplifier 100 is higher than for a single-stage amplifier.

The first amplifier stage is configured to amplify an analog input signal $x(z)$ in the analog and digital domains using a digital pulse width modulation (PWM) generator 110 (referred to herein as PWM 110), to provide a first stage output $y_1(z)$ for coupling to a load 170. The notations "$x(z)$", "$y_1(z)$", and the like indicate signal representations in the z-transform domain. In the first stage, input audio signal $x(z)$ is provided to a first input of a differential analog to digital converter (ADC) 102. A second input to ADC 102 is described further below. The resulting digital signal 104 is processed by a digital low pass filter (LPF) 106 having a transfer function $H(z)$. In the discussion herein, filters are sometimes referred to by their transfer functions for notational convenience where such transfer functions are denoted uniquely. The signal 108 outputted by filter 106 is processed by PWM 110, which is a device that generates a binary series of pulses having a duty cycle proportional to the instantaneous value of signal 108. The PWM carrier frequency may be denoted $f_c$. The binary pulse series generated by PWM 110 is amplified at switching module 122. For example, a pre-driver circuit 124 may be coupled to gates of PMOS transistor M1 and NMOS transistor M2 that are configured in a single-ended, half-bridge switching configuration. In other embodiments, a differential H-bridge switching configuration may be used. Transistors M1 and M2 provide amplified analog signal $y_1(z)$. Signal $y_1(z)$ is fed back to a passive analog low pass filter 114 having transfer function $B(z)$. LPF 114 includes resistor 118 and capacitor 116. LPF 114 provides signal 115 to the second input of ADC 102.

The quantization error associated with PWM 110 is isolated by subtracting between the input and output of PWM 110 at module 112 (i.e., subtracting the input of PWM 110 from the output of PWM 110, or vice-versa). Module 112 may be an adder that applies a gain of –1 to one of its inputs. Thus, PWM quantization noise of PWM 110 is extracted in the digital domain. Although FIG. 1 shows the input to PWM 110 being subtracted from the output of PWM 110, the order of subtraction may be reversed, as one of ordinary skill in the art will understand. The PWM error signal 128 is passed to the second stage of amplifier 100 for second-order spectral shaping and diminution. Spectral shaping may allow PWM noise to be moved out of the audio band of interest, e.g., to a frequency band inaudible to the human ear.

PWM error 128 undergoes amplification by a factor of k at gain module 130. The second amplifier stage is configured to spectrally shape and attenuate the amplified quantization error of the PWM generator 110 using another PWM generator 144, to provide a second stage output for coupling to load 170. At the second stage, the output signal 131 of gain module 130 is filtered at digital filter 140, which may be a high pass filter having a transfer function denoted PTF(z) (PTF stands for "PWM transfer function"). For example, PTF(z) may satisfy $PTF(z)=1/(1+H(z)B(z))$. After processing at adder 142, signal 143 is processed by PWM 144, which has a carrier frequency k times the carrier frequency of PWM 110 (i.e., the carrier frequency of PWM 144 is $k*f_c$). Adder 142 has first and second inputs. The first input is provided by filter 140. The second input is a feedback signal based on signal $y_2(z)$, which is an output of the second amplifier stage. As used herein, "*" denotes multiplication. Filter 148 spectrally shapes the quantization error of PWM 144. The resulting binary pulse series is amplified by switching at switching module 152, which includes pre-driver 154 and transistors M3 and M4 in a configuration similar to switching module 122. Switching module 152 provides amplified analog signal $y_2(z)$. Signals $y_1(z)$ and $y_2(z)$, which are intermediate output signals of the first and second stages, respectively, are passed to a differential load 170 (e.g., a loudspeaker), which generates an analog output signal $y(z)$. Signal $y_2(z)$ is converted to digital at ADC 160, and the result is subtracted at adder 146 from the input 143 to PWM 144. One of ordinary skill will understand that the order of subtraction may be reversed here.

The output of adder 146 is filtered at digital filter 148. Filter 148 may have a transfer function $H_e(z)=z^{-1}(2-z^{-1})$, with the following result for y(z):

$$y(z)=H(z)x(z)/(1+H(z)B(z))+H(z)q(z)(1-z^{-1})^2/(1+H(z)B(z))+p_2(z)(1-z^{-1})^2/k,$$

where q(z) is the quantization error of ADC 102 and $p_2(z)$ is the quantization error of PWM 144. The denominator "k" in the third summand of the preceding equation corresponds to diminution of error associated with PWM 144 by a factor of k, and the term $(1-z^{-1})^2$ corresponds to spectral shaping of that PWM error.

The following example transfer functions for filters 106 and 114 may be used, with notation indicating representation in the Laplace transform domain: $H(s)=G_1*(s+z_1)/(s+p_1)$, and $B(s)=G_2/(s+p_2)$, where $p_1$ and $p_2$ are poles, and $z_1$ is a zero, of the respective filters, and $G_1$ and $G_2$ are positive real numbers (e.g., $G_1=1000$ and $G_2=0.5$) corresponding to DC gains.

The use of a carrier frequency $k*f_c$ for PWM 144 (rather than $f_c$ as with PWM 110) is equivalent to digitally scaling down signal $y_2(z)$ by a factor of k (i.e., gain scaling) but eliminates the need for an analog divider, reducing complexity and cost and increasing practicability of implementation. The factor k may be arbitrary, and there are k effective signal levels at the output y. In some embodiments, k is an integer power of two, which may simplify system design and processing. Prior amplification methods cannot provide an arbitrary number of effective levels at the output. For example, a 2-level quantizer is described at Forejt et al., "A 700+−mW Class D Design with Direct Battery Hookup in a 90-nm Process," JSSC, September 2005, and a 3-level quantizer is described at Matamura et al., "Filterless Multi-Level Delta-Sigma Class-D Amplifier for Portable Applications," 2009 ISCAS, but embodiments of the present disclosure enable any number of quantization levels.

When the outputs $y_1(z)$ and $y_2(z)$ of the first and second stages, respectively, of amplifier 100 are combined, the linearity of the amplifier is improved compared to a single-stage amplifier. Conventional methods employing single PWM stages are limited in achievable resolution. Thus, the topology of FIG. 1 provides higher effective resolution than can be achieved by an equivalent single-stage architecture. Feedback is included at the first and second stages to correct for analog errors, e.g., power supply noise.

Block 101 includes analog circuit components. Digital circuit components external to block 101, e.g., digital filters 140 and 148, are easier to design and implement than the high precision analog components that are required by traditional amplification methods.

Figure 2:
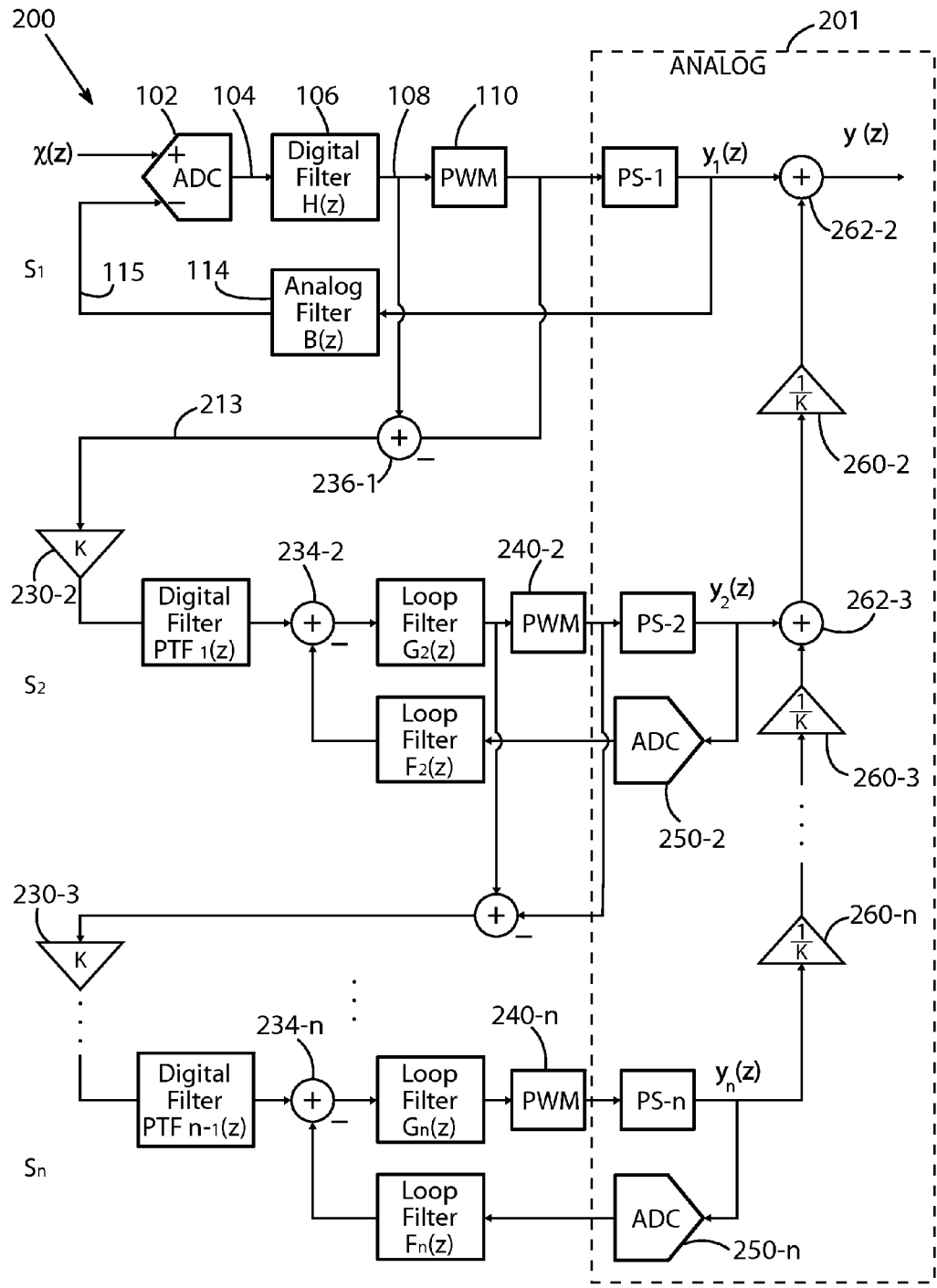
FIG. 2 is a block diagram of an n-stage amplifier in accordance with some embodiments.

The principles underlying the two-stage amplifier 100 in FIG. 1 may be extended to additional stages. FIG. 2 is a block diagram of an n-stage amplifier 200 in accordance with some embodiments, where n may be any integer greater than one. The first stage $S_1$ of amplifier 200 is similar to the first stage of amplifier 100. PWM switching module PS-1 may be the same as switching module 122. Adder 236-1 has a gain of −1 applied to a different input than does adder 112, in effect reversing the order of the subtraction implemented at that adder. The reason for this change relative to adder 112 is that in amplifier 100 of FIG. 1, combination of the outputs from the first and second stages is effected by a subtraction at load 170; in contrast, combination of the outputs from respective stages in amplifier 200 is effected by additive (not subtractive) units, as described further below.

The error signal 213 is gained up by a factor of k at inter-stage gain module 230-2 and then passed to the second stage $S_2$. The second stage $S_2$ may be termed a "successor stage" relative to the first stage $S_1$, and the first stage may be termed a "predecessor stage" relative to the second stage. The second stage includes digital filter $PTF_1(z)$, PWM 240-2, PWM switching module PS-2, and ADC 250-2 that are similar to corresponding components in the second stage of amplifier 100. Filter $PTF_1(z)$ and similar filters $PTF_i(z)$ at subsequent stages may be referred to as pre-loop filters because they precede a control loop at each stage as shown in FIG. 2. These pre-loop filters may be highpass filters. The output of filter $PTF_1(z)$ is combined with the output of a digital loop filter $F_2(z)$ as shown at combination module 234-2, with the resulting output processed at loop filter $G_2(z)$. The combination module at each stage $S_i$ after the first stage is configured to compute an addition or subtraction between the inputs to the combination module; subtraction is shown in the example of FIG. 2. An input of the PWM generator of each stage $S_i$ after the first stage is based on an output of the respective combination module. In FIG. 1, the functionality of a loop filter such as loop filter $G_2(z)$ is effectively merged into filter $H_e(z)$. The output signal $y_1(z)$ from the first stage, which may be referred to as a first stage output signal or a stage output signal of stage $S_1$, is passed to an inter-stage adder 262-2; the output signal $y_2(z)$ from the second stage, which may be referred to as a second stage output signal or a stage output signal of stage $S_2$) is passed to an inter-stage adder 262-3; etc.

Similar components as are provided at the second stage may be provided at subsequent stages as shown in FIG. 2, with reference numerals or subscripts that indicate the respective stage. Analog inter-stage attenuation modules 260-2, 260-3, . . . , 260-n may be provided, each providing attenuation by k (i.e., gain by a factor of 1/k), in which case the carrier frequency for each of PWM 240-2, . . . , 240-n may be the same as the carrier frequency $f_c$ for PWM 110. Thus, inter-stage attenuation modules, when provided, compensate for gain provided by inter-stage gain modules. Alternatively, using a carrier frequency of $k*f_c$ for the PWM units at the second through $n^{th}$ stages eliminates the need for attenuation modules 260-2, . . . , 260-n.

Block 201 includes analog circuit components. Digital circuit components in the second through $n^{th}$ stages are easy to design and implement and are inexpensive. In contrast to feedback control loop designs of prior amplifiers that have difficult stability issues, digital loops in various embodiments of the present disclosure are easily compensated.

The spectral shaping and PWM quantization error attenuation properties of amplifier 200 may be understood as follows. The output signal y(z) satisfies the following equation:

$$y(z)=y_1(z)+y_2(z)/k+\ldots+y_n(z)/k^n \quad (1)$$

The signal $y_1(z)$ may be expressed as:

$$y_1(z)=H(z)x(z)/(1+H(z)B(z))+H(z)q(z)(1-z^{-1})^n/(1+H(z)B(z))+p_1(z)/(1+H(z)B(z)), \quad (2)$$

where q(z) is quantization error of ADC 102 and $p_1(z)$ is quantization error of PWM 110.

The signal $y_2(z)$ may be expressed as:

$$y_2(z)=-k*p_1(z)*PTF_1(z)*STF_2(z)+p_2(z)*PTF_2(z), \quad (3)$$

where $PTF_1(z)=1/(1+H(z)B(z))$, $STF_2(z)=G_2(z)/(1+F_2(z)G_2(z))$, $PTF_2(z)=1/(1+F_2(z)G_2(z))$, and $p_2(z)$ is quantization error of PWM 240-2.

The signal $y_n(z)$ may be expressed as:

$$y_n(z)=-k*p_{n-1}(z)*PTF_{n-1}(z)*STF_n(z)+p_n(z)*PTF_n(z), \quad (4)$$

where $PTF_{n-1}(z)=1/(1+F_{n-1}(z)G_{n-1}(z))$, $STF_n(z)=G_n(z)/(1+F_n(z)G_n(z))$, $PTF_n(z)=1/(1+F_n(z)G_n(z))$, $p_{n-1}(z)$ is quantization error of PWM 240-(n−1), and $p_n(z)$ is quantization error of PWM 240-n.

Substituting equations (2), (3), and (4) into equation (1) yields:

$$y(z)=H(z)x(z)/(1+H(z)B(z))+H(z)q(z)(1-z^{-1})^n/(1+H(z)B(z))+p_n(z)*PTF_n(z)/k^{n-1} \quad (5)$$

The transfer function $PTF_n(z)$ may correspond to a high pass filter that spectrally shapes the PWM quantization error $p_n(z)$ in the last term of equation (5). Such spectral shaping may move that error to a high frequency out of the audio band of interest. Also, as seen in the denominator of the last term of equation (5), the inter-stage gain (k) or the number of stages (n) may be increased to suppress the PWM quantization error.

Any number of stages greater than one may be used. With sufficient stages, PWM quantization noise can be completely suppressed below the thermal noise floor. The use of n stages with a scale factor of k results in $k^{n-1}$ effective levels at the output. In effect, the performance of the topology of various embodiments is equivalent to employing multi-level PWM conversion.

Various embodiments do not require an external LC (inductor-capacitor) filter, unlike prior amplifiers. An LC filter is typically used in conventional single-stage amplifiers following a switching component to remove unwanted high-frequency components. The multi-stage filtering of embodiments of the present disclosure renders such an LC filter unnecessary, because there is a reduction in unwanted signal energy and therefore the amount of filtering needed for signal reconstruction is reduced. Also, complex analog integrators of some prior amplifier systems are not needed in various embodiments of the present disclosure. Elimination of these components results in die area reduction.

Various embodiments using n-stage filtering with inter-stage gain of k provide equivalent PWM noise suppression as a single composite PWM noise stage having k*n levels, while using fewer PWM unit elements. To achieve a PWM resolution of M (e.g., M=16) levels, a traditional (single-stage) amplifier requires M PWM unit elements; in contrast, embodiments of the present disclosure have only $\log_2(M)$ PWM unit elements for the same PWM resolution. The reduced PWM power stage component count results in reduced area and reduced power consumption.

Figure 3:
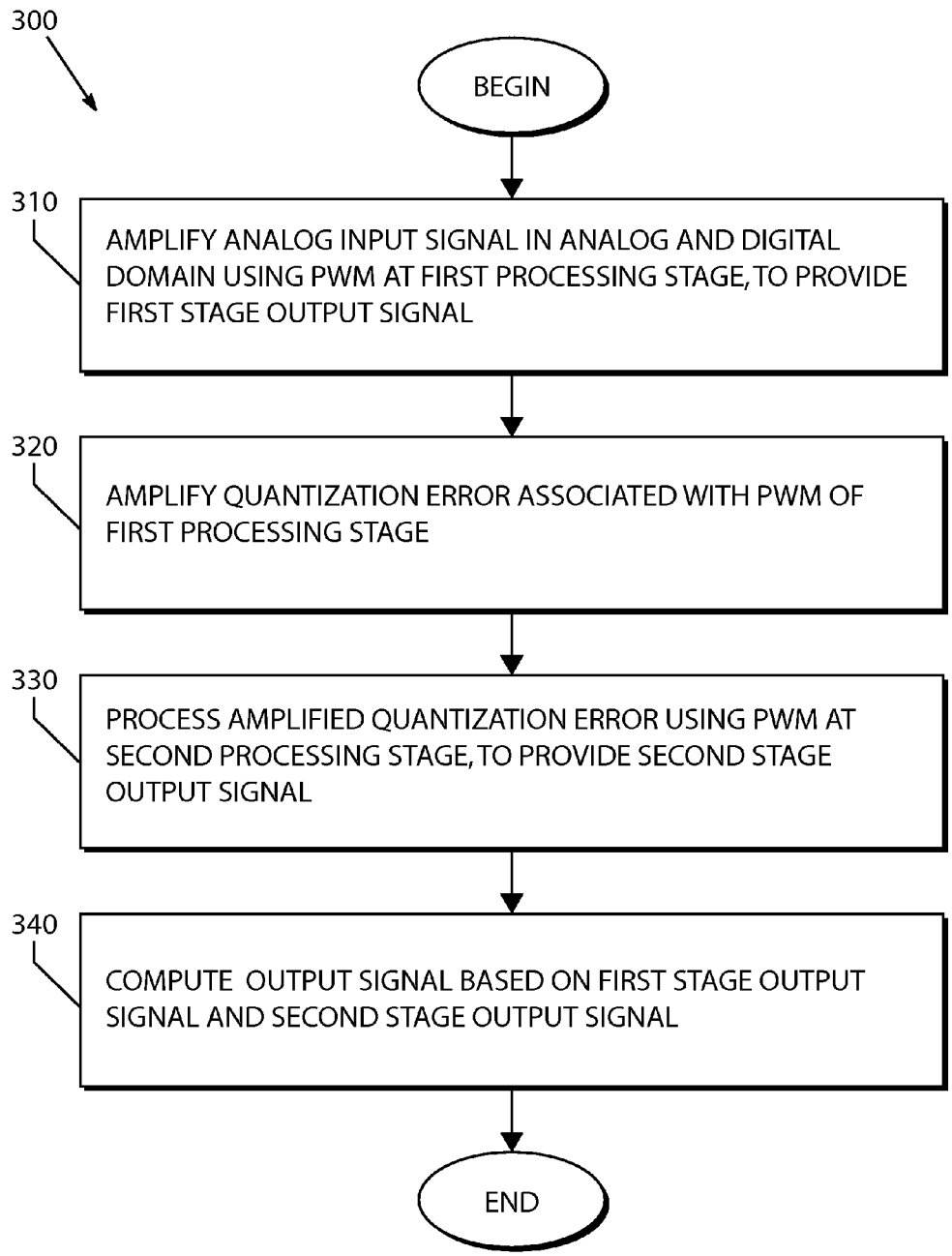
FIG. 3 is a flow diagram in accordance with some embodiments.

FIG. 3 is a flow diagram of a process 300 in accordance with some embodiments. After process 300 begins, an analog input signal is amplified (310) in the analog and digital domains using pulse width modulation (PWM) at a first processing stage, to provide a first stage output signal. A quantization error associated with the PWM of the first processing stage is amplified (320). The amplified quantization error is processed (330) using PWM at a second processing stage, to provide a second stage output signal. An output signal is computed (340) based on the first stage output signal and the second stage output signal. The output signal is an amplification of the analog input signal.

In some embodiments, a pulse width modulation (PWM) amplifier includes a first amplifier stage, a second amplifier stage, and a gain module. The first amplifier stage is configured to amplify an analog input signal in the analog and digital domains using a first pulse width modulation (PWM) generator, to provide a first stage output for coupling to a load. The gain module is configured to amplify a quantization error of the first PWM generator by a predetermined gain. The second amplifier stage is configured to spectrally shape and attenuate the amplified quantization error of the first PWM generator using a second PWM generator, to provide a second stage output for coupling to the load.

In some embodiments, a pulse width modulation (PWM) amplifier includes multiple amplifier stages, including a first stage $S_1$ and a last stage $S_N$, where N is an integer greater than 1. The PWM amplifier also includes an inter-stage gain module between each pair of adjacent stages $S_i$ and $S_{i+1}$. Each amplifier stage includes a pulse width modulation (PWM) generator. The first stage is configured to amplify an analog input signal in the analog and digital domains using the PWM generator of the first stage. A quantization error of the PWM generator of each stage $S_i$ before the last stage is provided to a successor stage $S_{i+1}$ succeeding stage $S_i$. Each inter-stage gain module between a pair of adjacent stages $S_i$ and $S_{i+1}$ is configured to amplify the quantization error of the PWM generator of stage $S_i$ by a predetermined gain.

In some embodiments, an analog input signal is amplified in the analog and digital domains using pulse width modulation (PWM) at a first processing stage, to provide a first stage output signal. A quantization error associated with the PWM of the first processing stage is amplified. The amplified quantization error is processed using PWM at a second processing stage, to provide a second stage output signal. An output signal is computed based on the first stage output signal and the second stage output signal. The output signal is an amplification of the analog input signal.

Although examples are illustrated and described herein, embodiments are nevertheless not limited to the details shown, since various modifications and structural changes may be made therein by those of ordinary skill within the scope and range of equivalents of the claims.

What is claimed is:

1. A pulse width modulation (PWM) amplifier comprising:
    a first amplifier stage configured to amplify an analog input signal in the analog and digital domains using a first pulse width modulation (PWM) generator, to provide a first stage output for coupling to a load;
    a gain module configured to amplify a quantization error of the first PWM generator by a predetermined gain;
    a second amplifier stage configured to spectrally shape and attenuate the amplified quantization error of the first PWM generator using a second PWM generator, to provide a second stage output for coupling to the load.

2. The PWM amplifier of claim 1, further comprising the load, wherein the analog input signal is an audio signal, and the load is a differential speaker.

3. The PWM amplifier of claim 1, further including a subtraction module configured to subtract between an input of the first PWM generator and an output of the first PWM generator to provide the quantization error of the first PWM generator.

4. The PWM amplifier of claim 1, wherein the second amplifier stage includes:
    a first filter configured to filter an output of the gain module;
    a switching module configured to amplify an output of the second PWM generator to provide the output of the second amplifier stage; and
    an adder having first and second inputs, the adder configured to add the first input and the second input to generate the input of the second PWM generator, wherein the first input is the output of the first filter, and the second input is a feedback signal based on the output of the second amplifier stage.

5. The PWM amplifier of claim 4, wherein the second amplifier stage further includes:
    an analog to digital converter (ADC) configured to convert the output of the second amplifier stage to a digital value; and a subtraction module configured to subtract between an input of the second PWM generator and the digital value outputted by the ADC;

wherein the feedback signal is based on an output of the subtraction module.

6. The PWM amplifier of claim 5, wherein the second amplifier stage further includes a second filter configured to filter the output of the subtraction module, wherein the feedback signal is an output of the second filter.

7. The PWM amplifier of claim 6, wherein the second filter has a transfer function represented in the z-domain as $z^{-1}(2-z^{-1})$.

8. The PWM amplifier of claim 4, wherein the first filter is a high pass filter.

9. The PWM amplifier of claim 1, wherein the predetermined gain is K, and a carrier frequency of the second PWM generator is K multiplied by a carrier frequency of the first PWM generator.

10. A pulse width modulation (PWM) amplifier comprising:
a plurality of amplifier stages including a first stage $S_i$ and a last stage $S_N$, N being an integer greater than 1, each stage including a pulse width modulation (PWM) generator, wherein the first stage is configured to amplify an analog input signal in the analog and digital domains using the PWM generator of the first stage, and wherein a quantization error of the PWM generator of each stage $S_i$ before the last stage is provided to a successor stage $S_{i+1}$ succeeding stage $S_i$; and
an inter-stage gain module between each pair of adjacent stages $S_i$ and $S_{i+1}$, said gain module configured to amplify the quantization error of the PWM generator of stage $S_i$ by a predetermined gain.

11. The PWM amplifier of claim 10, wherein each stage further includes a switching module configured to amplify an output of the PWM generator of said stage to provide a stage output signal of said stage;
wherein said PWM amplifier further comprises an inter-stage attenuation module between each pair of adjacent stages, said attenuation module configured to attenuate an input of said attenuation module by an attenuation factor K, wherein the predetermined gain of each inter-stage gain module is K.

12. The PWM amplifier of claim 11, further comprising an inter-stage adder between each pair of adjacent stages $S_i$ and $S_{i+1}$, said inter-stage adder configured to add the stage output signal of stage $S_i$ to an output of the inter-stage attenuation module between stages $S_i$ and $S_{i+1}$.

13. The PWM amplifier of claim 10, further comprising an inter-stage subtraction module between each pair of adjacent stages $S_i$ and $S_{i+1}$, said inter-stage subtraction module configured to subtract between an input of the PWM generator of stage $S_i$ and an output of the PWM generator of stage $S_i$, to generate an input to the inter-stage gain module between stages $S_i$ and $S_{i+1}$.

14. The PWM amplifier of claim 10, wherein each stage further includes:
a switching module configured to amplify an output of the PWM generator of said stage, to provide a stage output signal of said stage;
wherein each stage $S_i$ after the first stage further includes:
a combination module having a first input and a second input, said combination module configured to compute one of an addition and a subtraction between the first and second inputs, wherein an input of the PWM generator of said stage $S_i$ is based on an output of said combination module, and the first input is based on an output of the inter-stage gain module between said stage $S_i$ and a predecessor stage $S_{i-1}$, and the second input is a feedback signal based on the stage output signal of said stage $S_i$.

15. The PWM amplifier of claim 14, wherein each stage $S_i$ after the first stage further includes:
a first loop filter configured to filter an output of the combination module of stage $S_i$ to provide the input of the PWM generator of said stage $S_i$;
an analog to digital converter (ADC) configured to convert the stage output signal of said stage $S_i$ to a digital value; and
a second loop filter configured to filter the digital value outputted by the ADC to provide the second input of the combination module of said stage $S_i$.

16. The PWM amplifier of claim 15, wherein each stage $S_i$ between stages $S_2$ and $S_{n-1}$, inclusive, further includes a pre-loop filter configured to filter the output of the inter-stage gain module between a predecessor stage $S_{i-1}$ and said stage $S_i$ to provide the first input of the combination module of said stage $S_i$, said pre-loop filter having a transfer function represented in the z-domain as $1/(1+F_i(z) \cdot G_i(z))$, wherein $F_i(z)$ and $G_i(z)$ are transfer functions of the first and second loop filters of said stage $S_i$, respectively, and "·" represents multiplication.

17. The PWM amplifier of claim 16, wherein each pre-loop filter is a highpass filter.

18. A method comprising:
amplifying an analog input signal in the analog and digital domains using pulse width modulation (PWM) at a first processing stage, to provide a first stage output signal;
amplifying a quantization error associated with the PWM of the first processing stage;
processing the amplified quantization error using PWM at a second processing stage, to provide a second stage output signal; and
computing an output signal based on the first stage output signal and the second stage output signal, wherein the output signal is an amplification of the analog input signal.

19. The method of claim 18, further comprising:
amplifying a quantization error associated with the PWM of the second processing stage;
processing the amplified quantization error associated with the PWM of the second processing stage using PWM at a third processing stage, to provide a third stage output signal;
wherein the computed output signal is further based on the third stage output signal.

20. The method of claim 18, wherein processing at the second processing stage includes:
filtering, at a first digital filter, the amplified quantization error associated with the PWM of the first processing stage, to provide a first filtered signal;
filtering the second stage output signal in the digital domain at a second digital filter to provide a second filtered signal;
subtracting between the first and second filtered signals, to provide a difference signal;
filtering the difference signal at a third digital filter, to provide a third filtered signal;
pulse width modulating the third filtered signal, to provide a pulse width modulated signal; and
controlling a plurality of switches to amplify the pulse width modulated signal, to provide the second stage output signal.

* * * * *